United States Patent [19]

Aria

[11] Patent Number: 5,602,989
[45] Date of Patent: Feb. 11, 1997

[54] BUS CONNECTIVITY VERIFICATION TECHNIQUE

[75] Inventor: Percy R. Aria, Newark, Calif.

[73] Assignee: Advanced Micro Devices Inc., Sunnyvale, Calif.

[21] Appl. No.: 441,561

[22] Filed: May 15, 1995

[51] Int. Cl.$^6$ ............................................. G06F 11/00
[52] U.S. Cl. ........................ 395/183.19; 395/185.09
[58] Field of Search ................ 395/183.19, 185.09, 395/183.15, 182.02, 183.01; 371/67.1, 21.2, 21.3, 21.4, 24, 25.1

[56] References Cited

U.S. PATENT DOCUMENTS

| | | | |
|---|---|---|---|
| 4,622,669 | 11/1986 | Pri-Tal | 395/183.19 |
| 4,847,838 | 7/1989 | Kralik | 395/183.19 |
| 4,862,458 | 8/1989 | Baginski | 395/183.19 |
| 4,958,347 | 9/1990 | White et al. | 395/183.19 |
| 4,989,202 | 1/1991 | Soto et al. | 395/183.19 |
| 5,204,864 | 4/1993 | Won | 395/183.19 |
| 5,442,305 | 8/1995 | Martin et al. | 326/30 |
| 5,452,308 | 9/1995 | Kaminski et al. | 395/183.19 |

FOREIGN PATENT DOCUMENTS

| | | | |
|---|---|---|---|
| 0126322 | 11/1984 | European Pat. Off. | G01R 31/28 |
| 0370928 | 5/1990 | European Pat. Off. | G06F 11/22 |
| 2245713 | 1/1992 | United Kingdom | G01R 31/02 |

*Primary Examiner*—Robert W. Beausoliel, Jr.
*Assistant Examiner*—Joseph E. Palys
*Attorney, Agent, or Firm*—Townsend and Townsend and Crew LLP

[57] ABSTRACT

A testing method and apparatus for improving an efficiency of a post-production connectivity test of a bus coupling a semiconductor device to a bus connector each integrated on a system board. The method includes applying a special test fixture to the connector in lieu of a device designed to be operated by the particular bus. The test fixtures includes a plurality of memories having inputs and outputs connected to one of the conductors of the bus. By applying known patterns of signals to the memories and reading the outputs of the memories, connectivity of the bus is tested without operating the bus.

5 Claims, 2 Drawing Sheets

BUS CONNECTIVITY VERIFICATION TECHNIQUE

BACKGROUND OF THE INVENTION

The present invention relates generally to post-production testing procedures, and more particularly to verifying connectivity and continuity of a digital bus used in a computer.

FIG. 1 is a block schematic diagram of a conventional testing configuration 10 for testing connectivity and continuity of a bus under test (B.U.T.) 12 that connects a bus interface device 14 to a bus connector 16. BUT 12, device 14, and bus connector 16 are assembled on a system board 20. In certain applications, a host bus 22 couples device 14 to a central processing unit 24 that may or may not be integrated on system board 20. Device 14 provides interface control information and signals for communicating with a bus device 26 coupled to bus connector 16 by a bus 28.

In operation, CPU 24 accesses information from bus device 26 by issuing appropriate instructions to device 14. Device 14 translates the instructions into bus commands appropriate for the type of bus coupling device 14 to bus device 26. For proper operation, BUT 12 must be properly wired to connector 16. When testing an assembled system board 20, there are many tests that are performed. One fundamental test that is performed is to verify connectivity (proper wiring and continuity of the wiring) of BUT 12 between device 14 and connector 16. As system board 20 becomes complex, and because device 14 is a semiconductor device mounted or otherwise affixed to system board 20, it becomes increasingly difficult to verify proper connectivity of BUT 12.

For example, BUT 12 may be a Small Computer System Interface (SCSI) bus and device 14 would be a SCSI controller. For a conventional post-production test of the connectivity of the SCSI bus, a SCSI device (for bus device 26) such as a SCSI versions of a hard disk, printer, tape drive CD ROM, scanner, etc. is coupled to bus connector 16 using an appropriate cable for bus 28. Then, proper power, termination, and control signals must be provided as well known in order to operate the SCSI device. The results of operating the SCSI device must be interpreted by the testing program to determine whether BUT 12 is properly connected between device 14 and connector 16.

Unfortunately, there are many reasons for such a prior art test to fail that are not related to connectivity of BUT 12. Additionally, testing BUT 12 for connectivity using such a conventional system is inefficient as acquiring, connecting, powering up, and properly configuring SCSI device 26 and system board 20 are non-trivial tasks.

While the specific example was explained in terms of a SCSI bus, other common buses used in the computer environment experience similar types of inefficiencies when performing post-production connectivity testing. Some of the other types of buses include industry standard architecture (ISA), enhanced or extended ISA (EISA), microchannel, peripheral component interface (PCI), VESA, NU-Bus, etc.

SUMMARY OF THE INVENTION

The present invention provides method and apparatus for simply, efficiently and economically performing post-production testing of a connectivity of a signal bus used in a computer or data processor. The present invention permits testing of the bus connectivity without fully configuring and operating the bus and controlling devices as was required in the past.

According to one aspect of the invention for a method of testing a connectivity of a bus between a semiconductor device and a connector, the method includes the steps of attaching a test fixture to the connector, the test fixture including a memory responsive to an assertion of a first signal at an input of the memory to set a predetermined state at an output of the memory; thereafter asserting the first signal to the memory using a first set of conductors of the bus coupled to the input; thereafter accessing an output state of the memory using a second set of conductors of the bus coupled to the output; and thereafter comparing the output state to the predetermined state, wherein the first and the second sets of conductors are not improperly connected when the output state matches the predetermined state.

Reference to the remaining portions of the specification, including the drawing and claims, will realize other features and advantages of the present invention. Further features and advantages of the present invention, as well as the structure and operation of various embodiments of the present invention, are described in detail below with respect to accompanying drawing. In the drawing, like reference numbers indicate identical or functionally similar elements.

DESCRIPTION OF THE PREFERRED EMBODIMENTS

Figure 1:
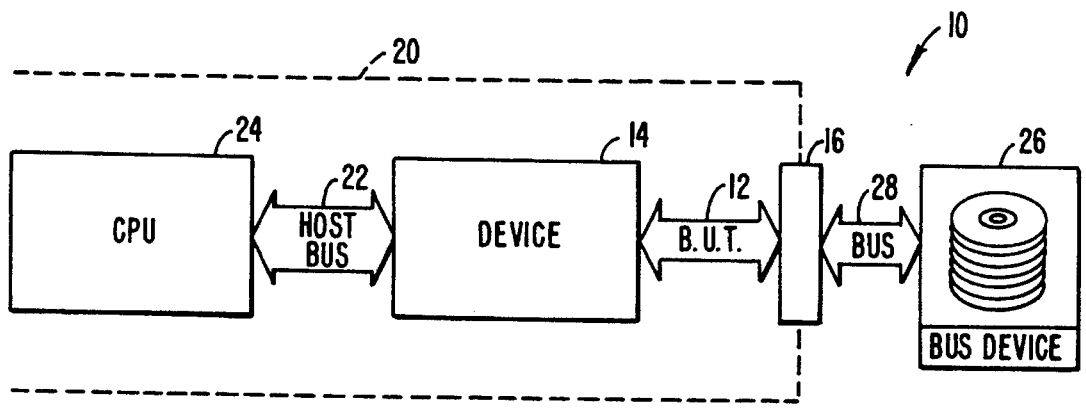
FIG. 1 is a block schematic diagram of a conventional testing apparatus.
Figure 2:
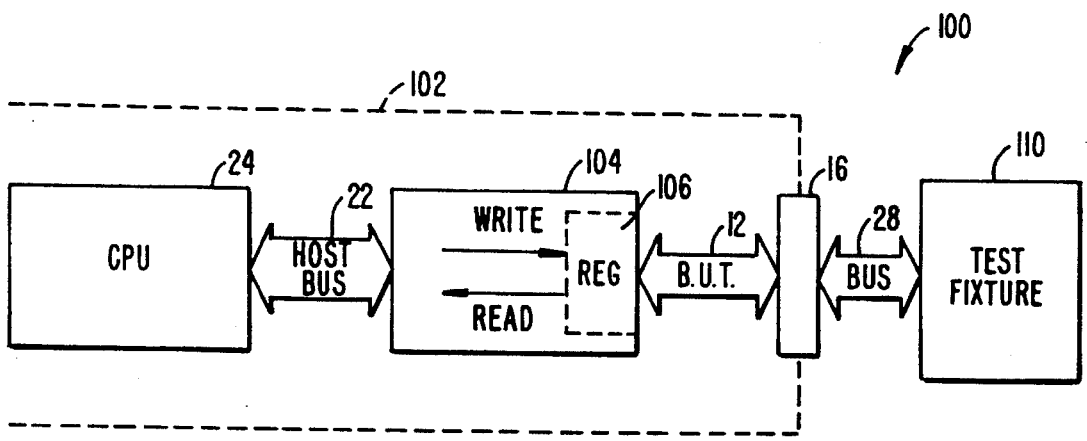
FIG. 2 is a block schematic diagram of a testing apparatus according to the preferred embodiment.

FIG. 2 is a block schematic diagram of a testing apparatus 100 according to the preferred embodiment. Testing apparatus 100 includes a system board 102 that is similar to system board 20 shown in FIG. 1 except that device 14 has been replaced with a particularly configured and configurable control device 104. Control device 104, like device 14, is typically a semiconductor device affixed to system board 102 and is designed to translate instructions from CPU 24 to bus commands that control a bus device 26.

Control device 104 includes a programmable register 106 that facilitates the translation and operation of the instructions. One preferred example using a SCSI bus implements register 106 as a SCSI bus and control (SBC) register included with an AM53C974A controller. The AM53C974A controller is commercially available from Advanced Micro Devices, Inc., POBox 3453 Sunnyvale, Calif. 94088. The presently available specification for the AM53C974A is hereby expressly incorporated by reference for all purposes.

Device 14 used in some conventional systems include a register such as the SBC register or similar register to that of register 106. However, conventional use of the register was to facilitate operation of B.U.T. 12 and was not specially configured to facilitate the testing procedure, except as collaterally required during actual operation of B.U.T. 12 and bus device 26.

In the preferred embodiment, register 106 is configured to permit desired values to be written and stored, in response to a write signal, and to permit values to be accessed and read, in response to a write signal. Details regarding the particular values to be written and read are explained in more detail below.

Test apparatus 100 further includes a test fixture 110 that bus 28 couples to connector 16 in place of bus device 26 shown in FIG. 1. Test fixture 110, in cooperation with the values written to and read from register 106, simplifies the testing of the connectivity of B.U.T. 12.

In operation, test fixture 110 is coupled to connector 16. In response to signals or values received from register 106, test fixture 110 configures itself and provides an output pattern that is accessed and read by register 106. By comparing the output pattern read to a template pattern that would be obtained from a properly predetermined connected and wired B.U.T. 12, connectivity of B.U.T. 12 is readily tested. The testing is simply accomplished without providing operating power (typically 120 volts AC) or loading configuration drivers and otherwise completely setting up a computing environment that uses system board 102.

Figure 3:
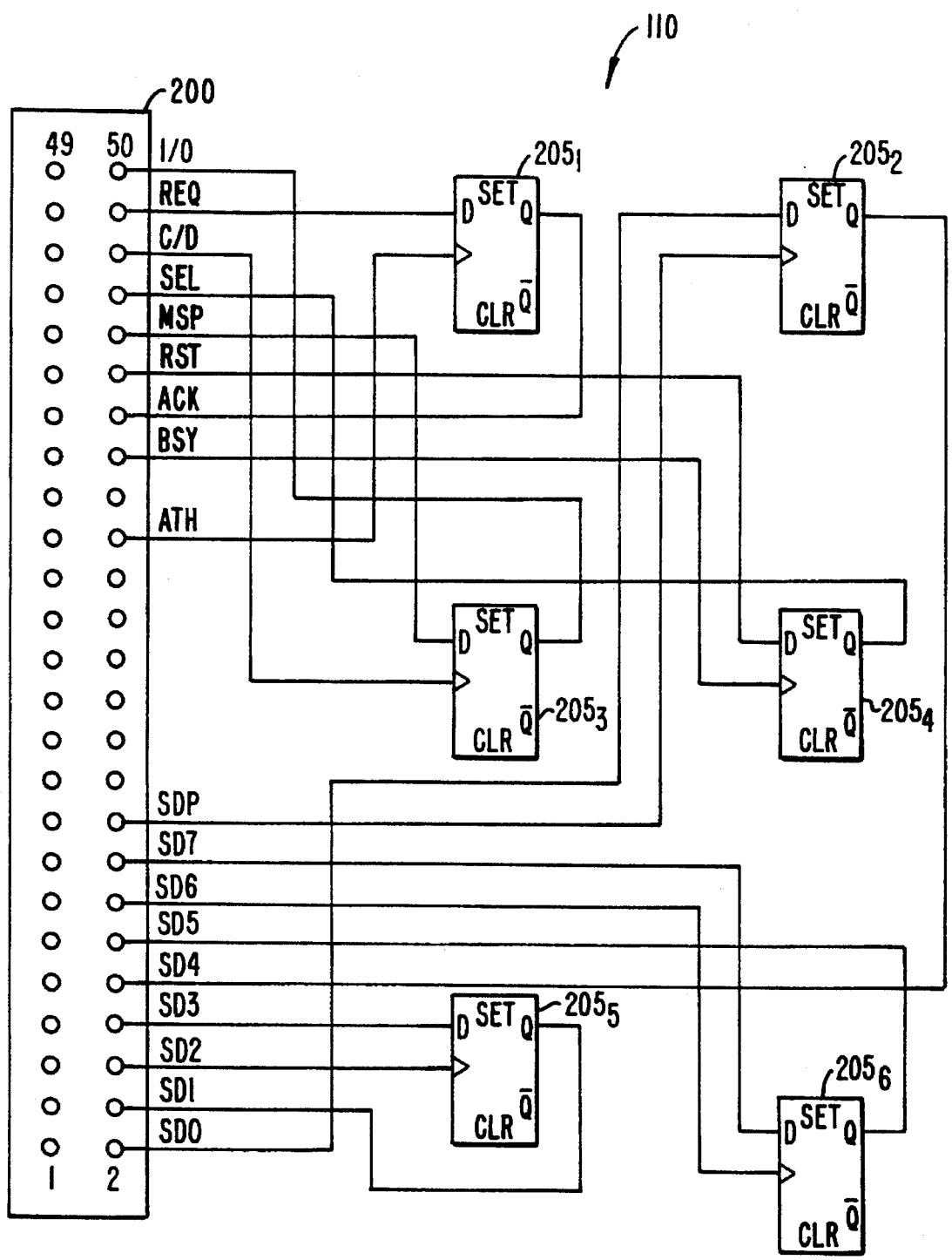
FIG. 3 is a block schematic diagram of a preferred embodiment of the test fixture shown in FIG. 2.

FIG. 3 is a block schematic diagram of a preferred embodiment of test fixture 110 shown in FIG. 2. Test fixture 110 includes a connector 200 coupled to a plurality of memory devices $205_i$. Each memory device 205 receives an input signal from one set of conductors and drives, at an output, a predetermined value on another set of conductors. In some cases, there may be a single conductor in a set, but each conductor of B.U.T. 12 (shown in FIG. 2) that is to be tested is included in at least one set of conductors coupled to at least one memory. Writing a particular pattern at an input of the plurality of memories $205_i$ and reading the output pattern will, when comparing the output pattern to a predetermined pattern, determine whether B.U.T. 12 is properly connected.

In the preferred embodiment, B.U.T. 12 is a SCSI bus and connector 16 shown in FIG. 2 is a standard 50-pin connector. Connector 200 is designed to test eighteen SCSI signals (I/O, REQ, C/D, SEL, MSG, RST, ACK, BSY, ATN, SDP, and SD7-SD0), though other configurations and embodiments will be designed to test other signals, or other buses. The particular type of bus under test is not a limitation of the present invention. Each memory $205_i$ of the preferred embodiment is a D-type flip-flop that is well known in the art. D-type flip-flops have a data input, a clock input, and an output. A binary value present on the data input is latched to the output upon a particular transition of a signal at the clock input. The output value is stored until a new binary value is latched to the output by another transition of the clock signal.

Thus, by coupling selected conductors to the data and clock inputs and applying a known binary pattern to the memories, an output pattern on the outputs of the flip-flops is accessed (by a different set of conductors of B.U.T. 12). The output pattern is compared to a template that represents a properly connected B.U.T. 12. Deviations of the output pattern from the template therefore indicates a connectivity error. Register 106, shown in FIG. 2, writes a desired input pattern on sets of conductors of B.U.T. 12 coupled to the data and clock inputs of memories $205_i$ and thereafter reads the output pattern on sets of conductors of B.U.T. 12 coupled to the outputs of memories $205_i$. Each particular B.U.T. 12 may require a different configuration, but for the preferred embodiment having eighteen conductors that are tested, six memories are used. While the particular input pattern that is applied depends upon the particular connection, it is important that each conductor be coupled to at least one input or output of one of the memories.

Table I below illustrates a series of test patterns (and expected output patterns resulting therefrom) for the particular configuration shown in FIG. 3. In Table I, two patterns are applied to the identified conductors to set the memories to a particular configuration. The patterns are identified in Table I in a desired time sequence for application to produce the desired output pattern. After writing two input patterns (the purpose of the two patterns is to provide the proper transition sequence for triggering the flip-flop), the application of the identified pattern produces an output pattern of the memories that is read by register 106. The testing program that controls the reads and writes of register 106 masks the eighteen bit value read from B.U.T. 12 (shown in the pattern by an X or don't care designation) to locate the desired bits representing the outputs of the memories 205 in test fixture 110. The outputs are compared to anticipated values to determine proper connectivity as described above.

In the preferred embodiment and as reflected in Table I, two output patterns are actually generated. The two output patterns are complements of each other and help to ensure the validity of the connectivity test by requiring that both output patterns be properly generated from application of the series of input patterns.

TABLE I

| R/W | REQ | ACK | RST | BSY | SEL | ATN | MSG | C/D | I/O | SDP | SD7 | SD6 | SD5 | SD4 | SD3 | SD2 | SD1 | SD0 |
|---|---|---|---|---|---|---|---|---|---|---|---|---|---|---|---|---|---|---|
| W | 1 | 0 | 0 | 1 | 1 | 1 | 1 | 1 | 0 | 1 | 0 | 1 | 1 | 1 | 1 | 1 | 0 | 0 |
| W | 1 | 0 | 0 | 0 | 1 | 0 | 1 | 0 | 0 | 0 | 0 | 0 | 1 | 1 | 1 | 0 | 0 | 0 |
| R | X | 1 | X | X | 0 | X | X | X | 1 | X | X | X | 0 | 0 | X | X | 1 | X |
| W | 0 | 1 | 1 | 1 | 0 | 1 | 0 | 1 | 1 | 1 | 1 | 1 | 0 | 0 | 0 | 1 | 1 | 1 |
| W | 0 | 1 | 1 | 0 | 0 | 0 | 0 | 0 | 1 | 0 | 1 | 0 | 0 | 0 | 0 | 0 | 1 | 1 |
| R | X | 0 | X | X | 1 | X | X | X | 0 | X | X | X | 1 | 1 | X | X | 0 | X |

R/W — Read/Write
R — Read
W — Write
X — Don't care

It is one advantage of the preferred embodiment that test fixture power and ground requirements are available directly from B.U.T. 12 (but are not shown for clarity). Other embodiments may require a separate power supply for the test fixture. Also, in an alternate preferred embodiment, it is possible that the $\overline{Q}$ output of the memories (e.g., flip-flops) could be used to develop a test pattern by coupling one or more conductors of B.U.T. 12 to the $\overline{Q}$ outputs.

In conclusion, the present invention provides a simple, efficient solution to a problem of post-production testing of computer buses. While the above is a complete description of the preferred embodiments of the invention, various alternatives, modifications, and equivalents may be used. For example, while the preferred embodiment describes use of a flip-flop as the memory in the test fixture, other memories or configurations are possible. For example, in some embodiments, it may be desirable to use counters that increment (or decrement) a count in response to an input signal received from a set of conductors and to compare the count value with an anticipated value. Therefore, the above description should not be taken as limiting the scope of the invention which is defined by the appended claims.

What is claimed is:

1. A method for testing a connectivity of a bus between a semiconductor device affixed to a wiring board and a connector coupled to the wiring board, comprising the steps of:

attaching a test fixture to the connector, said test fixture including a memory responsive to an assertion of a first signal at an input of said memory to set a predetermined state at an output of said memory; thereafter asserting said first signal to said memory using a first set of conductors of the bus coupled to said input; thereafter accessing an output state of said memory using a second set of conductors of the bus coupled to said output; and thereafter comparing said output state to said predetermined state, wherein said first and said second sets of conductors are not improperly connected when said output state matches said predetermined state.

2. A method for testing a connectivity of a bus between a semiconductor device affixed to a wiring board and a connector coupled to the wiring board, comprising the steps of:

attaching a test fixture to the connector, said test fixture including a memory responsive to an assertion of a first signal at an input of said memory to set a predetermined state at an output of said memory; thereafter asserting said first signal to said memory using a first set of conductors of the bus coupled to said input; thereafter accessing an output state of said memory using a second set of conductors of the bus coupled to said output; and thereafter comparing said output state to said predetermined state, wherein said first and said second sets of conductors are not improperly connected when said output state matches said predetermined state;

wherein said memory is responsive to a second signal at said input for setting a second predetermined state at said output, said second predetermined state different than said first predetermined state, the method further comprising the steps of:

asserting said second signal, after said accessing step, to said input using said first set of conductors; and thereafter accessing a second output state of said memory using said second set of conductors; and thereafter comparing said second output state to said second predetermined state, wherein said first and said second set of conductors are not improperly connected when said second output state matches second predetermined state.

3. A method for testing a connectivity of a bus between a semiconductor device affixed to a wiring board and a connector coupled to the wiring board, comprising the steps of:

attaching a test fixture to the connector, said test fixture including a memory responsive to an assertion of a first signal at an input of said memory to set a predetermined state at an output of said memory; thereafter asserting said first signal to said memory using a first set of conductors of the bus coupled to said input; thereafter accessing an output state of said memory using a second set of conductors of the bus coupled to said output; and thereafter comparing said output state to said predetermined state, wherein said first and said second sets of conductors are not improperly connected when said output state matches said predetermined state;

wherein said memory is a D-type flip-flop and said first set of conductors include a first connection to a data input of said flip-flop and a second connection to a clock input of said flip-flop, and said second set of conductors include a third connection to an output of said flip-flop.

4. A method for testing a connectivity of a bus between a semiconductor device affixed to a wiring board and a connector coupled to the wiring board, comprising the steps of:

attaching a test fixture to the connector, said test fixture including a memory responsive to an assertion of a first signal at an input of said memory to set a predetermined state at an output of said memory; thereafter asserting said first signal to said memory using a first set of conductors of the bus coupled to said input; thereafter accessing an output state of said memory using a second set of conductors of the bus coupled to said output; and thereafter comparing said output state to said predetermined state, wherein said first and said second sets of conductors are not improperly connected when said output state matches said predetermined state;

wherein said memory is a counter having an input and an output wherein a count value stored in said counter and provided at said output is responsive to a particular signal at said input, and said first set of conductors include a connection to said counter input and said second set of conductors include connections to said counter output to access said count value as said predetermined value.

5. A method for testing a connectivity of a bus between a semiconductor device affixed to a wiring board and a connector coupled to the wiring board, comprising the steps of:

attaching a test fixture to the connector, said test fixture including a memory responsive to an assertion of a first signal at an input of said memory to set a predetermined state at an output of said memory; thereafter asserting said first signal to said memory using a first set of conductors of the bus coupled to said input; thereafter accessing an output state of said memory using a second set of conductors of the bus coupled to said output; and thereafter comparing said output state to said predetermined state, wherein said first and said second sets of conductors are not improperly connected when said output state matches said predetermined state;

wherein the bus includes N number of conductors, N being a whole number at least equal to two, and wherein said test fixture includes a plurality of memories each having a set of conductors coupled to an input and a set of conductors coupled to an output wherein each of said N number of conductors is in one of said sets of conductors coupled to one of said memories.

* * * * *